United States Patent
Ogawa et al.

(10) Patent No.: US 11,915,938 B2
(45) Date of Patent: Feb. 27, 2024

(54) METHOD OF MANUFACTURING SEMICONDUCTOR DEVICE, SUBSTRATE PROCESSING APPARATUS, AND RECORDING MEDIUM

(71) Applicant: KOKUSAI ELECTRIC CORPORATION, Tokyo (JP)

(72) Inventors: Arito Ogawa, Toyama (JP); Atsuro Seino, Toyama (JP)

(73) Assignee: Kokusai Electric Corporation, Tokyo (JP)

( * ) Notice: Subject to any disclaimer, the term of this patent is extended or adjusted under 35 U.S.C. 154(b) by 0 days.

(21) Appl. No.: 18/085,970

(22) Filed: Dec. 21, 2022

(65) Prior Publication Data
US 2023/0131197 A1    Apr. 27, 2023

Related U.S. Application Data

(63) Continuation of application No. 16/800,744, filed on Feb. 25, 2020, now Pat. No. 11,538,688, which is a continuation of application No. PCT/JP2018/011719, filed on Mar. 23, 2018.

(30) Foreign Application Priority Data

Sep. 25, 2017   (JP) ................ 2017-183406

(51) Int. Cl.
*H01L 21/285* (2006.01)
*C23C 16/34* (2006.01)
(Continued)

(52) U.S. Cl.
CPC ........ *H01L 21/28568* (2013.01); *C23C 16/34* (2013.01); *C23C 16/52* (2013.01)

(58) Field of Classification Search
CPC ................ C23C 16/52; C23C 16/4408; C23C 16/45525; C23C 16/34; C23C 16/45531;
(Continued)

(56) References Cited

U.S. PATENT DOCUMENTS

2003/0082296 A1    5/2003  Elers et al.
2003/0143841 A1*   7/2003  Yang ................. C23C 16/515
                                                438/653
(Continued)

FOREIGN PATENT DOCUMENTS

JP    2011-006783 A    1/2011
JP    2015-067869 A    4/2015

OTHER PUBLICATIONS

International Search Report and translation, PCT/JP2018/011719, dated Jun. 26, 2018, 5 pgs.
(Continued)

*Primary Examiner* — Sonya McCall-Shepard
(74) *Attorney, Agent, or Firm* — Volpe Koenig

(57) ABSTRACT

There is provided a method of manufacturing a semiconductor device, including forming a metal nitride film substantially not containing a silicon atom on a substrate by sequentially repeating: (a) supplying a metal-containing gas and a reducing gas, which contains silicon and hydrogen and does not contain a halogen, to the substrate in a process chamber by setting an internal pressure of the process chamber to a value which falls within a range of 130 Pa to less than 3,990 Pa during at least the supply of the reducing gas, wherein (a) includes a timing of simultaneously supplying the metal-containing gas and the reducing gas; (b) removing the metal-containing gas and the reducing gas that remain in the process chamber; (c) supplying a nitrogen-containing gas to the substrate; and (d) removing the nitrogen-containing gas remaining in the process chamber.

17 Claims, 11 Drawing Sheets

(51) Int. Cl.
*C23C 16/52* (2006.01)
*H01L 21/768* (2006.01)
*C23C 16/455* (2006.01)
*C23C 16/458* (2006.01)
*H01L 21/28* (2006.01)
*H01L 21/02* (2006.01)
*C23C 16/44* (2006.01)

(58) Field of Classification Search
CPC ......... C23C 16/45527; H01L 21/28556; H01L 21/0228; H01L 21/28568; H01L 21/02175; H01L 21/28562; H01L 21/20; H01L 21/76843; H01L 21/7685
See application file for complete search history.

(56) References Cited

U.S. PATENT DOCUMENTS

| | | | |
|---|---|---|---|
| 2003/0148605 A1* | 8/2003 | Shimogaki | H01L 28/75 438/653 |
| 2005/0271812 A1* | 12/2005 | Myo | C23C 16/4412 427/248.1 |
| 2006/0264038 A1 | 11/2006 | Kato | |
| 2010/0297846 A1 | 11/2010 | Kaga et al. | |
| 2015/0093911 A1 | 4/2015 | Nakatani et al. | |
| 2016/0079070 A1 | 3/2016 | Ogawa et al. | |
| 2016/0233100 A1 | 8/2016 | Godet et al. | |
| 2018/0190496 A1* | 7/2018 | Ashihara | H01L 21/32051 |

OTHER PUBLICATIONS

Korean Office Action dated Mar. 16, 2021 for Korean Patent Application No. 10-2020-7005122.
Japanese Office Action dated Apr. 27, 2021 for Japanese Patent Application No. 2019-542974.
Chinese Office Action dated Feb. 4, 2023 for Chinese Patent Application No. 201880055326.0.
Chinese Office Action dated Oct. 12, 2023 for Chinese Patent Application No. 201880055326.0.

* cited by examiner

|  | Present example | Comparative example |
|---|---|---|
| Deposition rate | 0.127nm/cycle | 0.029nm/cycle |
| Resistivity | 178uΩcm | 225uΩcm |

| Film composition (atoms%) | Present example | Comparative example |
|---|---|---|
| Ti | 40.7 | 49.2 |
| N | 59.2 | 49.8 |
| Cl | 0.08 | 1.00 |

METHOD OF MANUFACTURING SEMICONDUCTOR DEVICE, SUBSTRATE PROCESSING APPARATUS, AND RECORDING MEDIUM

CROSS-REFERENCE TO RELATED APPLICATIONS

This application is a continuation application of U.S. patent application Ser. No. 16/800,744 filed Feb. 25, 2020, which is a Bypass Continuation Application of PCT international Application No. PCT/JP2018/011719, filed on Mar. 23, 2018 which claims the benefit of priority from Japanese Patent Application No. 2017-183406, filed on Sep. 25, 2017, the entire contents of which is incorporated herein by reference.

TECHNICAL FIELD

The present disclosure relates to a method of manufacturing a semiconductor device, a substrate processing apparatus, and a recording medium.

BACKGROUND

A tungsten (W) film, for example, is used for a control gate of a NAND-type flash memory having a three-dimensional structure, and a tungsten hexafluoride ($WF_6$) gas containing W is used for forming the W film. Further, a titanium nitride (TiN) film may be formed as a barrier film between the W film and an insulating film. The TiN film serves to enhance adhesion between the W film and the insulating film, and also to prevent fluorine (F) contained in the W film from diffusing into the insulating film and the film formation is generally performed using a titanium tetrachloride ($TiCl_4$) gas and an ammonia ($NH_3$) gas.

As described above, the TiN film used as the barrier film is formed using the $TiCl_4$ gas and the $NH_3$ gas, and there is hydrochloric acid (HCl) as a byproduct generated in the film-forming process. This HCl is adsorbed on the surface of the TiN film which results in reducing a deposition rate, or the like.

SUMMARY

The present disclosure provides some embodiments of a technique capable of reducing a film formation inhibiting factor of a metal film by supplying a reducing gas that reacts with a byproduct generated in a film-forming process into a process chamber and discharging it to an outside of the process chamber.

According to one embodiment of the present disclosure, there is provided a technique that forms a metal nitride film substantially not containing a silicon atom on a substrate by sequentially repeating: (a) supplying a metal-containing gas and a reducing gas, which contains silicon and hydrogen and does not contain a halogen, to the substrate by setting an internal pressure of a process chamber to a value which falls within a range of 130 Pa to less than 3,990 Pa during at least the supply of the reducing gas, wherein (a) includes a timing of simultaneously supplying the metal-containing gas and the reducing gas; (b) removing the metal-containing gas and the reducing gas that remain in the process chamber; (c) supplying a nitrogen-containing gas to the substrate; and (d) removing the nitrogen-containing gas remaining in the process chamber.

BRIEF DESCRIPTION OF DRAWINGS

The accompanying drawings, which are incorporated in and constitute a part of the specification, illustrate embodiments of the present disclosure.

FIGS. 14A to 14C are diagrams illustrating XPS spectra of a TiN film formed according to the present example and a TiN film formed according to the comparative example, in which FIG. 14A illustrates a XPS spectrum of titanium (Ti2p), FIG. 14B illustrates a XPS spectrum of nitrogen (N1s), and FIG. 14C illustrates a XPS spectrum of chlorine (Cl2p).

DETAILED DESCRIPTION

Figure 1:
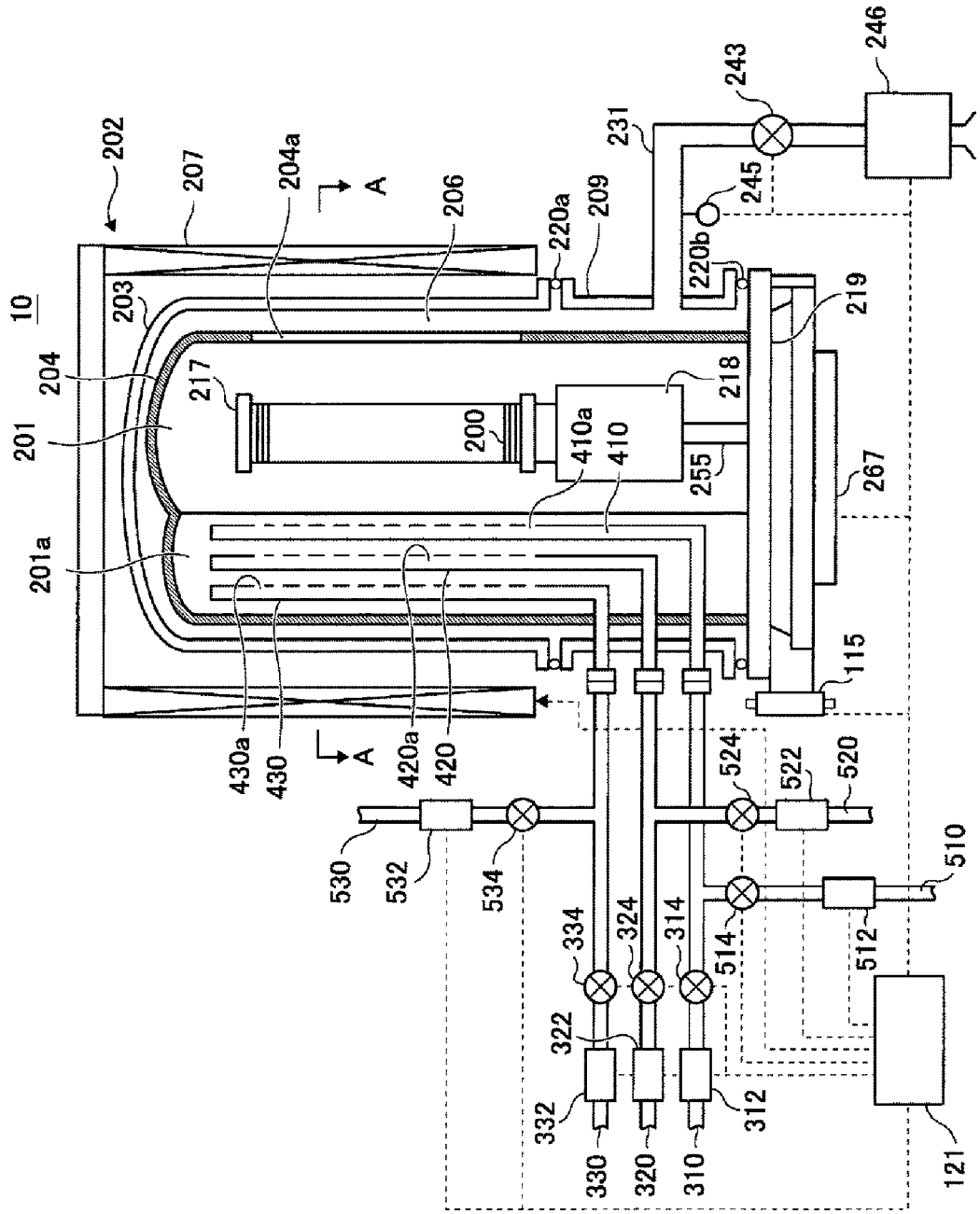
FIG. 1 is a vertical cross sectional view schematically illustrating a vertical type process furnace of a substrate processing apparatus according to an embodiment of the present disclosure.

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

First Embodiment of the Present Disclosure

A first embodiment of the present disclosure will now be described with reference to FIGS. 1 to 4.

(1) Configuration of the Substrate Processing Apparatus

A substrate processing apparatus 10 includes a process furnace 202 having a heater 207 as a heating means (a heating mechanism or a heating system) installed therein. The heater 207 has a cylindrical shape and is supported by a heater base (not shown) as a holding plate so as to be vertically installed.

An outer tube 203 constituting a reaction vessel (process vessel) is disposed inside the heater 207 to be concentric with the heater 207. The outer tube 203 is made of a heat resistant material, for example, quartz ($SiO_2$), silicon carbide (SiC) or the like, and has a cylindrical shape with its upper end closed and its lower end opened. A manifold (inlet flange) 209 is disposed below the outer tube 203 in a concentric relationship with the outer tube 203. The manifold 209 is made of a metal material such as, for example, stainless steel (SUS), and has a cylindrical shape with its upper and lower ends opened. An O-ring 220a as a seal member is installed between the upper end of the manifold 209 and the outer tube 203. The manifold 209 is supported by the heater base such that the outer tube 203 is vertically installed.

An inner tube 204 constituting the reaction vessel is disposed inside the outer tube 203. The inner tube 204 is made of a heat resistant material, for example, quartz ($SiO_2$), silicon carbide (SiC) or the like, and has a cylindrical shape with its upper end closed and its lower end opened. The process vessel (reaction vessel) is mainly configured by the outer tube 203, the inner tube 204, and the manifold 209. A process chamber 201 is formed in a hollow cylindrical portion (inside the inner tube 204) of the process vessel.

The process chamber 201 is configured to accommodate wafers 200 as substrates, in such a state that the wafers 200 are arranged in a horizontal posture and in multiple stages along a vertical direction in a boat 217 which will be described later.

Nozzles 410, 420, and 430 are installed in the process chamber 201 so as to penetrate a sidewall of the manifold 209 and the inner tube 204. Gas supply pipes 310, 320, and 330 are respectively connected to the nozzles 410, 420, and 430. However, the process furnace 202 of the present embodiment is not limited to the aforementioned configuration.

Mass flow controllers (MFCs) 312, 322, and 332, which are flow rate controllers (flow rate control parts), are installed in the gas supply pipes 310, 320, and 330 sequentially from the corresponding upstream sides, respectively. In addition, valves 314, 324, and 334, which are opening/closing valves, are installed in the gas supply pipes 310, 320, and 330, respectively. Gas supply pipes 510, 520, and 530, which supply an inert gas, are respectively connected to the gas supply pipes 310, 320 and 330 at the downstream side of the valves 314, 324, and 334. MFCs 512, 522, and 532, which are flow rate controllers (flow rate control parts), and valves 514, 524, and 534, which are opening/closing valves, are installed in the gas supply pipes 510, 520, and 530 sequentially from the corresponding upstream sides, respectively.

The nozzles 410, 420, and 430 are respectively connected to front end portions of the gas supply pipes 310, 320, and 330. The nozzles 410, 420, and 430 are configured as L-shaped nozzles. Horizontal portions of the nozzles 410, 420, and 430 are formed to penetrate the sidewall of the manifold 209 and the inner tube 204. Vertical portions of the nozzles 410, 420, and 430 are formed inside a channel-shaped (groove-shaped) preliminary chamber 201a formed to protrude outward of the inner tube 204 in a radial direction and extend along the vertical direction, and is also formed to extend upward along the inner wall of the inner tube 204 in the preliminary chamber 201a (upward in the arrangement direction of the wafers 200).

The nozzles 410, 420, and 430 are installed to extend from a lower region of the process chamber 201 to an upper region of the process chamber 201, and a plurality of gas supply holes 410a, 420a, and 430a are respectively formed at the opposite positions of the wafers 200, so as to allow a processing gas to be supplied from the gas supply holes 410a, 420a, and 430a of the nozzles 410, 420, and 430 to the wafers 200. The gas supply holes 410a, 420a, and 430a may be formed in a plural number between the lower portion of the inner tube 204 and the upper portion of the inner tube 204. The respective gas supply holes 410a, 420a, and 430a may have the same opening area and may be formed at the same opening pitch. However, the gas supply holes 410a, 420a, and 430a are not limited to the aforementioned configuration. For example, the opening area may be gradually enlarged from the lower portion of the inner tube 204 to the upper portion of the inner tube 204. Thus, it is possible to make the flow rate of a gas supplied from the gas supply holes 410a, 420a and 430a more uniform.

The gas supply holes 410a, 420a, and 430a of the nozzles 410, 420, and 430 may be formed in a plural number at height positions from the lower portion of the boat 217 to the upper portion of the boat 217 as described later. Therefore, the processing gas, which is supplied from the gas supply holes 410a, 420a, and 430a of the nozzles 410, 420 and 430 into the process chamber 201, is supplied to an entire region of the wafers 200 accommodated from the lower portion of the boat 217 to the upper portion of the boat 217. The nozzles 410, 420, and 430 may be installed to extend from the lower region of the process chamber 201 to the upper region of the process chamber 201, but may be installed to extend up to near the ceiling of the boat 217.

A precursor gas (metal-containing gas) which contains a metal element, as the processing gas, is supplied from the gas supply pipe 310 into the process chamber 201 via the MFC 312, the valve 314, and the nozzle 410. As the precursor, it may be possible to use, for example, a titanium tetrachloride ($TiCl_4$) which contains titanium (Ti) as a metal element and which is a halogen-based precursor (a halide or a halogen-based titanium precursor).

A reducing gas as the processing gas is supplied from the gas supply pipe 320 into the process chamber 201 via the MFC 322, the valve 324, and the nozzle 420. As the reducing gas, it may be possible to use, for example, a silane ($SiH_4$) gas, as the reducing gas, for example, that contains silicon (Si) and hydrogen (H) and does not contain a halogen. The $SiH_4$ acts as a reducing agent.

A reaction gas as the processing gas is supplied from the gas supply pipe 330 into the process chamber 201 via the MFC 332, the valve 334, and the nozzle 430. As the reaction gas, it may be possible to use, for example, an ammonia (NH₃) gas as an N-containing gas containing, for example, nitrogen (N).

An inert gas, for example, a nitrogen (N₂) gas, is supplied from the gas supply pipes 510, 520, and 530 into the process chamber 201 via the MFCs 512, 522, and 532, the valves 514, 524, and 534, and the nozzles 410, 420, and 430. An example in which the N₂ gas is used as the inert gas will be described below, but a rare gas such as, for example, an argon (Ar) gas, a helium (He) gas, a neon (Ne) gas, a xenon (Xe) gas or the like, in addition to the N₂ gas, may be used as the inert gas.

Although a processing gas supply system is mainly configured by the gas supply pipes 310, 320, and 330, the MFCs 312, 322, and 332, the valves 314, 324, and 334, and the nozzles 410, 420, and 430, only the nozzles 410, 420 and 430 may be regarded as the processing gas supply system. The processing gas supply system may be simply referred to as a gas supply system. When a precursor gas is allowed to flow from the gas supply pipe 310, although a precursor gas supply system is mainly configured by the gas supply pipe 310, the MFC 312, and the valve 314, it may be regarded that the nozzle 410 is included in the precursor gas supply system. Furthermore, when a reducing gas is allowed to flow from the gas supply pipe 320, although a reducing gas supply system is mainly configured by the gas supply pipe 320, the MFC 322, and the valve 324, it may be regarded that the nozzle 420 is included in the reducing gas supply system. In addition, when a reaction gas is allowed to flow from the gas supply pipe 330, although a reaction gas supply system is mainly configured by the gas supply pipe 330, the MFC 332, and the valve 334, it may be regarded that the nozzle 430 is included in the reaction gas supply system. When a nitrogen-containing gas is supplied as the reaction gas from the gas supply pipe 330, the reaction gas supply system may be referred to as a nitrogen-containing gas supply system. Furthermore, an inert gas supply system is mainly configured by the gas supply pipes 510, 520, and 530, the MFC 512, 522, and 532, and the valves 514, 524, and 534.

In a gas supply method according to the present embodiment, a gas is transferred via the nozzles 410, 420, and 430, which are disposed in the preliminary chamber 201*a* in a vertically-elongated space with an annular shape which is defined by the inner wall of the inner tube 204 and the end portions of the wafers 200. The gas is injected from the gas supply holes 410*a*, 420*a* and 430*a* formed at the opposite positions of the nozzles 410, 420 and 430 from the wafers into the inner tube 204. More specifically, the precursor gas or the like is injected from the gas supply hole 410*a* of the nozzle 410, the gas supply hole 420*a* of the nozzle 420, and the gas supply hole 430*a* of the nozzle 430 in a direction parallel to the surfaces of the wafers 200.

An exhaust hole (exhaust port) 204*a* is a through hole formed on the sidewall of the inner tube 204 and at the opposite position of the nozzles 410, 420, and 430, and is, for example, a vertically-elongated slit-shaped through hole. A gas, which is supplied from the gas supply holes 410*a*, 420*a*, and 430*a* of the nozzles 410, 420, and 430 into the process chamber 201 and flows onto the surface of the wafer 200, flows through an exhaust passage as a gap formed between the inner tube 204 and the outer tube 203 through the exhaust hole 204*a*. Then, the gas flowing through the exhaust passage 206 flows through the exhaust pipe 231 and is discharged to the outside of the process furnace 202.

The exhaust hole 204*a* is formed at the opposite position of the wafers 200, and the gas supplied from the gas supply holes 410*a*, 420*a*, and 430*a* to near the wafers 200 in the process chamber 201 flows in the horizontal direction and then flows through the exhaust passage 206 through the exhaust hole 204*a*. The exhaust hole 204*a* is not limited to being configured as the slit-shaped through hole but may be configured as a plurality of holes.

An exhaust pipe 231, which is configured to exhaust an internal atmosphere of the process chamber 201, is installed in the manifold 209. A pressure sensor 245 as a pressure detector (pressure detection part) which detects the internal pressure of the process chamber 201, an auto pressure controller (APC) valve 243, and a vacuum pump 246 as a vacuum exhaust device are connected to the exhaust pipe 231 sequentially from the corresponding upstream side. The APC valve 243 is configured so that a vacuum exhaust of the interior of the process chamber 201 and a vacuum exhaust stop can be performed by opening and closing the APC valve 243 while operating the vacuum pump 246 and so that the internal pressure of the process chamber 201 can be adjusted by adjusting an opening degree of the APC valve 243 while operating the vacuum pump 246. An exhaust system is mainly configured by the exhaust hole 204*a*, the exhaust passage 206, the exhaust pipe 231, the APC valve 243, and the pressure sensor 245. It may be regarded that the vacuum pump 246 is included in the exhaust system.

A seal cap 219, which serves as a furnace opening cover configured to hermetically seal a lower end opening of the manifold 209, is installed under the manifold 209. The seal cap 219 is configured to make contact with the lower end portion of the manifold 209 from the lower side in the vertical direction. The seal cap 219 is made of metal such as, for example, stainless steel (SUS) or the like, and is formed in a disc shape. An O-ring 220*b*, which is a seal member making contact with the lower end portion of the manifold 209, is installed on an upper surface of the seal cap 219. A rotation mechanism 267 configured to rotate the boat 217 which accommodates the wafers 200 is installed at the opposite side of the process chamber 201 in the seal cap 219. A rotary shaft 255 of the rotation mechanism 267, which penetrates the seal cap 219, is connected to the boat 217. The rotation mechanism 267 is configured to rotate the wafers 200 by rotating the boat 217. The seal cap 219 is configured to be vertically moved up and down by a boat elevator 115 which is an elevator mechanism vertically installed outside the outer tube 203. The boat elevator 215 is configured to load and unload the boat 217 into and from the process chamber 201 by moving the seal cap 219 up and down. The boat elevator 215 is configured as a transfer device (transfer mechanism) which transfers the boat 217 and the wafers 200 accommodated in the boat 217 into and out of the process chamber 201.

The boat 217 serving as a substrate support is configured to support a plurality of wafers 200, for example, 25 to 200 wafers, in such a state that the wafers 200 are arranged in a horizontal posture and in multiple stages along a vertical direction with the centers of the wafers 200 aligned with one another. That is, the boat 217 is configured to arrange the wafers 200 in a spaced-apart relationship. The boat 217 is made of a heat resistant material such as quartz or SiC. Heat insulating plates 218 made of a heat resistant material such as quartz or SiC are installed below the boat 217 in a horizontal posture and in multiple stages (not shown). With this configuration, it is hard for heat generated from the heater 207 to be transferred to the seal cap 219. However, the present embodiment is not limited to the aforementioned configuration. For example, instead of installing the heat insulating plates 218 below the boat 217, a heat insulating tube as a tubular member made of a heat resistant material such as quartz or SiC may be installed under the boat 217.

Figure 2:
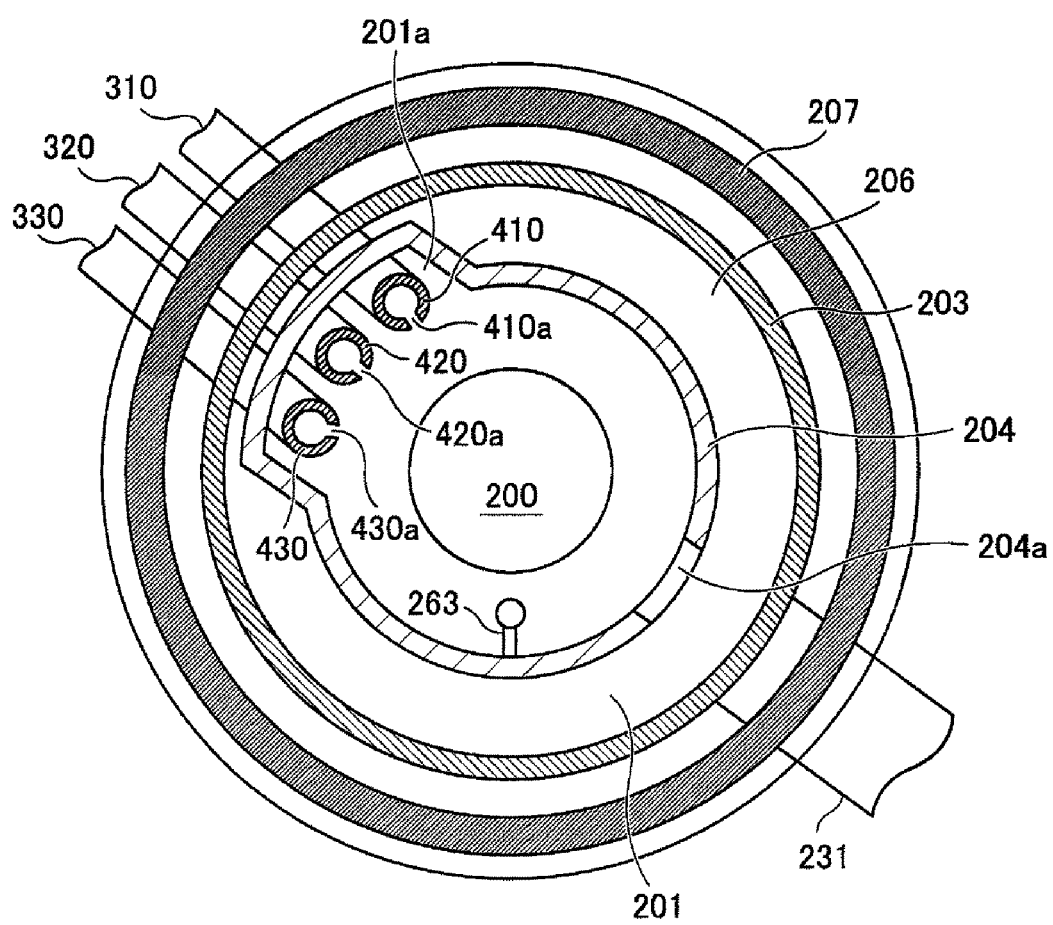
FIG. 2 is a schematic cross sectional view taken along line A-A in FIG. 1.

As illustrated in FIG. 2, a temperature sensor 263 serving as a temperature detector is installed in the inner tube 204. Based on temperature information detected by the temperature sensor 263, an amount of electric power supplied to the heater 207 is adjusted such that the interior of the process chamber 201 has a desired temperature distribution. Similar to the nozzles 410, 420 and 430, the temperature sensor 263 is formed in an L shape. The temperature sensor 263 is installed along the inner wall of the inner tube 204.

Figure 3:
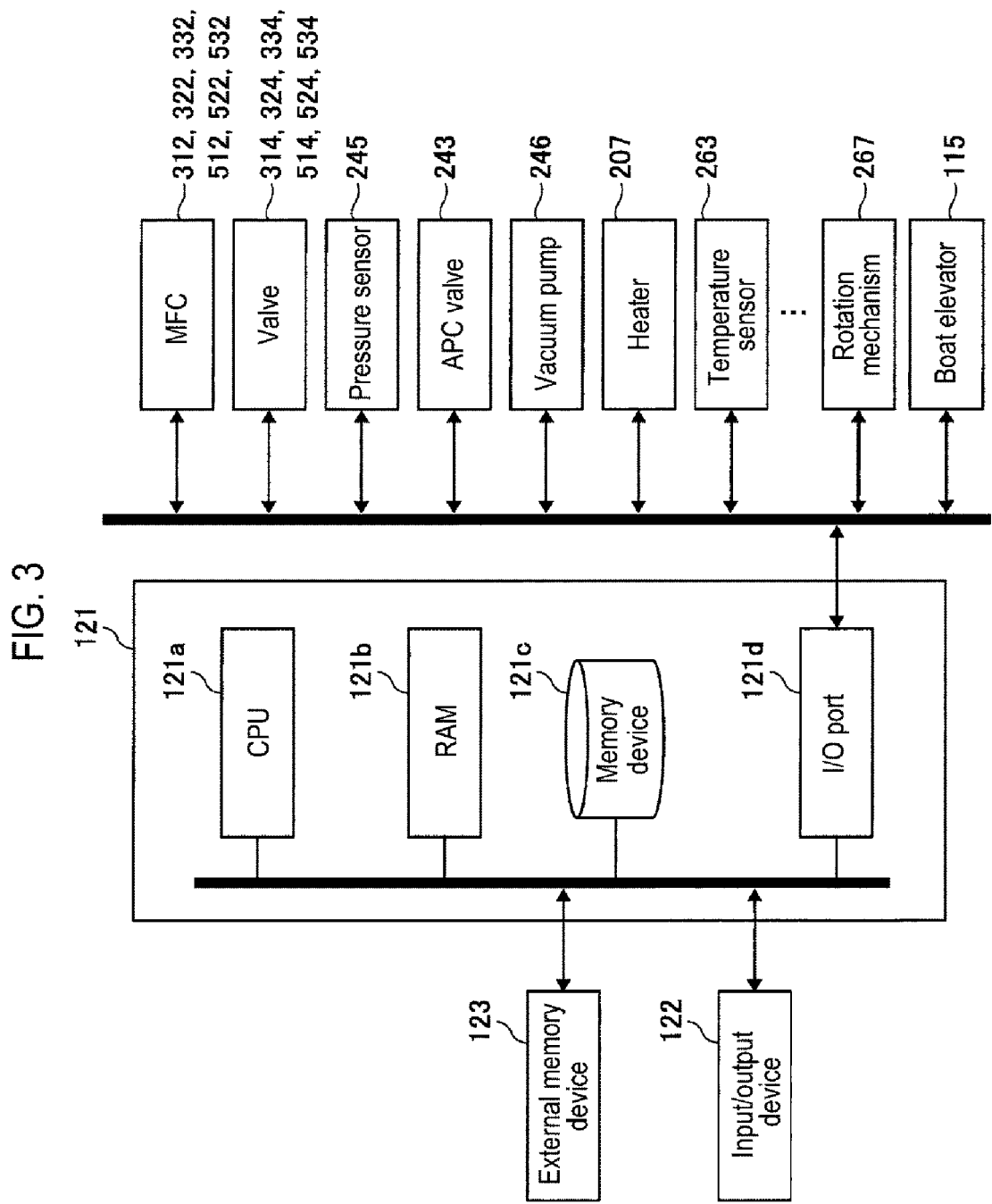
FIG. 3 is a schematic configuration diagram of a controller of the substrate processing apparatus according to one embodiment of the present disclosure, in which a control system of the controller is shown in a block diagram.

As illustrated in FIG. 3, a controller 121, which is a control part (control means), may be configured as a computer including a central processing unit (CPU) 121a, a random access memory (RAM) 121b, a memory device 121c, and an I/O port 121d. The RAM 121b, the memory device 121c and the I/O port 121d are configured to exchange data with the CPU 121a via an internal bus 121e. An input/output device 122 formed of, for example, a touch panel or the like, is connected to the controller 121.

The memory device 121c is configured by, for example, a flash memory, a hard disk drive (HDD), or the like. A control program for controlling operations of a substrate processing apparatus, a process recipe for specifying sequences and conditions of a method of manufacturing a semiconductor device as described later, or the like is readably stored in the memory device 121c. The process recipe functions as a program for causing the controller 121 to execute each process (each step) in the method of manufacturing a semiconductor device, as described later, to obtain a predetermined result. Hereinafter, the process recipe and the control program will be collectively and simply referred to as a "program." When the term "program" is used herein, it may indicate a case of including only the process recipe, a case of including only the control program, or a case of including both the process recipe and the control program. The RAM 121b is configured as a memory area (work area) in which a program, data or the like read by the CPU 121a is temporarily stored.

The I/O port 121d is connected to the MFCs 312, 322, 332, 512, 522, and 532, the valves 314, 324, 514, 524, and 534, the pressure sensor 245, the APC valve 243, the vacuum pump 246, the heater 207, the temperature sensor 263, the rotation mechanism 267, the boat elevator 115, and the like, as described above.

The CPU 121a is configured to read the control program from the memory device 121c and execute the same. The CPU 121a also reads the recipe from the memory device 121c according to an input of an operation command from the input/output device 122. In addition, the CPU 121a is configured to control, according to the contents of the recipe thus read, the flow rate adjusting operation of various kinds of gases by the MFCs 312, 322, 332, 512, 522, and 532, the opening/closing operation of the valves 314, 324, 514, 524, and 534, the opening/closing operation of the APC valve 243, the pressure regulating operation performed by the APC valve 244 based on the pressure sensor 245, the temperature adjusting operation performed by the heater 207 based on the temperature sensor 263, the driving and stopping of the vacuum pump 246, the operation of rotating the boat 217 with the rotation mechanism 267 and adjusting the rotation speed of the boat 217, the operation of moving the boat 217 up and down with the boat elevator 115, the operation of accommodating the wafers 200 in the boat 217, and the like.

The controller 121 may be configured by installing, on the computer, the aforementioned program stored in an external memory device 123 (for example, a magnetic tape, a magnetic disc such as a flexible disc or a hard disc, an optical disc such as a CD or DVD, a magneto-optical disc such as an MO, or a semiconductor memory such as a USB memory or a memory card). The memory device 121c or the external memory device 123 is configured as a computer-readable recording medium. Hereinafter, the memory device 121c and the external memory device 123 will be collectively and simply referred to as a "recording medium." In the present disclosure, the term "recording medium" may indicate a case of including only the memory device 121c, a case of including only the external memory device 123, or a case of including both the memory device 121c and the external memory device 123. Furthermore, the program may be supplied to the computer using a communication means such as the Internet or a dedicated line, instead of using the external memory device 123.

(2) Substrate Processing (Film-Forming Process)

An example of a process of forming, for example, a metal film constituting a gate electrode on a wafer 200, which is one of the processes for manufacturing a semiconductor device, will be described with reference to FIG. 4. The process of forming a metal film is performed using the process furnace 202 of the aforementioned substrate processing apparatus 10. In the following descriptions, the operations of the respective parts constituting the substrate processing apparatus 10 are controlled by the controller 121.

In the substrate processing (a process of manufacturing a semiconductor device) according to the present embodiment, a TiN film substantially not containing a silicon atom on a wafer is formed by sequentially repeating: a first step of supplying a $TiCl_4$ gas as a metal-containing gas, and a $SiH_4$ gas as a reducing gas, which contains silicon and hydrogen and does not containing a halogen, to the substrate by setting an internal pressure of the process chamber 201 to a value which falls within a range of 130 Pa to less than 3,990 Pa during at least the supply of the $SiH_4$ gas, wherein the first step includes a timing of simultaneously supplying the $TiCl_4$ gas and the $SiH_4$ gas; a second step of removing the $TiCl_4$ gas and the $SiH_4$ gas that remain in the process chamber 201; a third step of supplying an $NH_3$ gas as a nitrogen-containing gas to the wafer 200; and a fourth step of removing the $NH_3$ gas remaining in the process chamber 201.

When the term "wafer" is used herein, it may refer to "a wafer itself" or "a laminated body of a wafer and a predetermined layer or film formed on the surface of the wafer". In addition, when the phrase "a surface of a wafer" is used herein, it may refer to "a surface of a wafer itself" or "a surface of a predetermined layer or film formed on a wafer". Furthermore, when the term "substrate" is used herein, it may be synonymous with the term "wafer."

In addition, in the present disclosure, the phrase "TiN film containing no Si atom" may include a case where a Si content in the TiN film is very low, for example, a case where a Si content in the TiN film is about 4% or 4% or less in some embodiments, such as a case where the TiN film contains almost no Si atom or a case where the TiN film contains substantially no Si atom film, in addition to a case where the TiN film contains no Si atom.

(Wafer Loading)

If a plurality of wafers 200 is charged on the boat 217 (wafer charging), as illustrated in FIG. 1, the boat 217 supporting the plurality of wafers 200 is lifted up by the boat elevator 115 and is loaded into the process chamber 201

(boat loading). In this state, the seal cap 219 seals the lower end of the reaction tube 203 through the O-ring 220.
(Pressure Regulation and Temperature Adjustment)

The interior of the process chamber 201 is vacuum-exhausted by the vacuum pump 246 so as to reach a desired pressure (degree of vacuum). In this operation, the internal pressure of the process chamber 201 is measured by the pressure sensor 245. The APC valve 243 is feedback-controlled based on the measured pressure information (pressure regulation). The vacuum pump 246 may be continuously activated at least until the processing of the wafers 200 is completed. Furthermore, the interior of the process chamber 201 is heated by the heater 207 to a desired temperature. In this operation, the amount of electric power supplied to the heater 207 is feedback-controlled based on the temperature information detected by the temperature sensor 263 such that the interior of the process chamber 201 has a desired temperature distribution (temperature adjustment). The heating of the interior of the process chamber 201 by the heater 207 may be continuously performed at least until the processing of the wafers 200 is completed.

[First Step]
(TiCl$_4$ Gas Supply)

The valve 314 is opened to allow a TiCl$_4$ gas as a precursor gas to flow through the gas supply pipe 310. The flow rate of the TiCl$_4$ gas is adjusted by the MFC 312. The TiCl$_4$ gas is supplied from the gas supply hole 410a of the nozzle 410 into the process chamber 201 and is exhausted from the exhaust pipe 231. At this time, the TiCl$_4$ gas is supplied to the wafer 200. Simultaneously, the valve 514 is opened to allow an inert gas such as an N$_2$ gas to flow through the gas supply pipe 510. The flow rate of the N$_2$ gas flowing through the gas supply pipe 510 is adjusted by the MFC 512. The N$_2$ gas is supplied to the process chamber 201 together with the TiCl$_4$ gas and is exhausted from the exhaust pipe 231. At this time, in order to prevent the TiCl$_4$ gas from entering the nozzles 420 and 430, the valves 524 and 534 are opened to allow the N$_2$ gas to flow through the gas supply pipes 520 and 530. The N$_2$ gas is supplied into the process chamber 201 via the gas supply pipes 320 and 330 and the nozzles 420 and 430 and is exhausted from the exhaust pipe 231.

At this time, the internal pressure of the process chamber 201 may be set at a pressure which falls within a range of, for example, 1 to 3,990 Pa, by adjusting the APC valve 243. The supply flow rate of the TiCl$_4$ gas controlled by the MFC 312 may be set at a flow rate which falls within a range of, for example, 0.1 to 2.0 slm. The supply flow rates of the N$_2$ gas controlled by the MFCs 512, 522, and 532 may be respectively set at a flow rate which falls within a range of, for example, 0.1 to 20 slm. At this time, the temperature of the heater 207 is set such that the temperature of the wafer 200 becomes a temperature which falls within a range of, 300 to 600 degrees C.

At this time, the gases flowing through the process chamber 201 are only the TiCl$_4$ gas and the N$_2$ gas. By supplying the TiCl$_4$ gas, a Ti-containing layer is formed on the wafer 200 (an underlying film on its surface). The Ti-containing layer may be a Ti layer containing Cl or an adsorption layer of TiCl$_4$, or may include both of them.

(SiH$_4$ Gas Supply)

After a lapse of a predetermined time, for example, after 0.01 to 5 seconds, from the start of the supply of the TiCl$_4$ gas, the valve 324 is opened to allow a SiH$_4$ gas as a reducing gas to flow through the gas supply pipe 320. The flow rate of the SiH$_4$ gas is adjusted by the MFC 322. The SiH$_4$ gas is supplied from the gas supply hole 420a of the nozzle 420 into the process chamber 201 and is exhausted from the exhaust pipe 231. Simultaneously, the valve 524 is opened to allow an inert gas such as an N$_2$ gas to flow through the gas supply pipe 520. The flow rate of the N$_2$ gas flowing through the gas supply pipe 520 is adjusted by the MFC 522. The N$_2$ gas is supplied into the process chamber 201 together with the SiH$_4$ gas and is exhausted from the exhaust pipe 231. At this time, in order to prevent the TiCl$_4$ gas and the SiH$_4$ gas from entering the nozzle 430, the valve 534 is opened to allow the N$_2$ gas to flow through the gas supply pipe 530. The N$_2$ gas is supplied into the process chamber 201 via the gas supply pipe 330 and the nozzle 430 and is exhausted from the exhaust pipe 231. At this time, the TiCl$_4$ gas, the SiH$_4$ gas, and the N$_2$ gas are simultaneously supplied to the wafer 200. That is, at least the TiCl$_4$ gas and the SiH$_4$ gas have a timing to be simultaneously supplied.

At this time, the internal pressure of the process chamber 201 may be set at a pressure which falls within a range of, for example, 130 to 3,990 Pa, specifically 500 to 2,660 Pa, or more specifically 900 to 1,500 Pa, by adjusting the APC valve 243. If the internal pressure of the process chamber 201 is lower than 130 Pa, Si contained in the SiH$_4$ gas enters the Ti-containing layer so that the Si content (in the film) contained in the formed TiN film may be increased to become a TiSiN film. Similarly, if the internal pressure of the process chamber 201 is higher than 3,990 Pa, Si contained in the SiH$_4$ gas enters the Ti-containing layer so that the Si content contained in the formed TiN film may be increased to become a TiSiN film. As described above, if the internal pressure of the process chamber 201 is too low or too high, the element composition of the formed film is varied. The supply flow rate of the SiH$_4$ gas controlled by the MFC 322 may be set at a flow rate which falls within a range of, for example, 0.1 to 5 slm, specifically 0.5 to 3 slm, or more specifically 1 to 2 slm. The supply flow rates of the N$_2$ gas controlled by the MFCs 512, 522, and 532 may be respectively set at a flow rate which falls within a range of, for example, 0.01 to 20 slm, specifically 0.1 to 10 slm, or more specifically 0.1 to 1 slm. At this time, the temperature of the heater 207 may be set at the same temperature as that used at the TiCl$_4$ gas supply step.

After a lapse of a predetermined time, for example, after 0.01 to 10 seconds, from the start of the supply of the TiCl$_4$ gas, the valve 314 of the gas supply pipe 310 is closed to stop the supply of the TiCl$_4$ gas. That is, the time for supplying the TiCl$_4$ gas to the wafer 200 may be set at a time within a range of, for example, 0.01 to 10 seconds. At this time, in order to prevent the SiH$_4$ gas from entering the nozzles 410 and 430, the valves 514 and 534 are opened to allow the N$_2$ gas to flow through the gas supply pipes 510 and 530. The N$_2$ gas is supplied into the process chamber 201 via the gas supply pipes 310 and 330 and the nozzles 410 and 430, and then exhausted from the exhaust pipe 231. At this time, the SiH$_4$ gas and the N$_2$ gas are supplied to the wafer 200.

[Second Step]
(Residual Gas Removal)

After a lapse of a predetermined time, for example, after 0.01 to 60 seconds, specifically 0.1 to 30 seconds, or more specifically 1 to 20 seconds, from the start of the supply of the SiH$_4$ gas, the valve 324 is closed to stop the supply of the SiH$_4$ gas. That is, the time for supplying the SiH$_4$ gas to the wafer 200 may be set at a time within a range of, for example, 0.01 to 60 seconds, specifically 0.1 to 30 seconds, or more specifically 1 to 20 seconds. If the time for supplying the SiH$_4$ gas to the wafer 200 is shorter than 0.01 second, there is a possibility that HCl, which is a growth inhibiting factor, is not sufficiently reduced by the $SiH_4$ gas and remains in the Ti-containing layer. If the time for supplying the $SiH_4$ gas to the wafer 200 is longer than 60 seconds, there is a possibility that Si contained in the $SiH_4$ gas enters the Ti-containing layer so that the Si content contained in the formed TiN film may be increased to become a TiSiN film. At this time, the interior of the process chamber 201 is vacuum-exhausted by the vacuum pump 246 while keeping the APC valve 243 of the exhaust pipe 231 opened, and the unreacted $TiCl_4$ gas and $SiH_4$ gas or the $TiCl_4$ gas and $SiH_4$ gas after contribution to the formation of the Ti-containing layer, which remain in the process chamber 201, are removed from the interior of the process chamber 201. At this time, the supply of the $N_2$ gas into the process chamber 201 is maintained while keeping the valves 514, 524, and 534 opened. The $N_2$ gas acts as a purge gas. This makes it possible to enhance the effect of removing the unreacted $TiCl_4$ gas and $SiH_4$ gas or the $TiCl_4$ gas and $SiH_4$ gas after the contribution to the formation of the Ti-containing layer, which remain in the process chamber 201, from the interior of the process chamber 201. At this time, HCl, which is a growth inhibiting factor, reacts with $SiH_4$ to be discharged from the interior of the process chamber 201 as silicon tetrachloride ($SiCl_4$) and $H_2$.

[Third Step]
($NH_3$ Gas Supply)

After the residual gas in the process chamber 201 is removed, the valve 334 is opened to allow an $NH_3$ gas as a reaction gas to flow through the gas supply pipe 330. The flow rate of the $NH_3$ gas is adjusted by the MFC 332. The $NH_3$ gas is supplied from the gas supply hole 430a of the nozzle 430 into the process chamber 201 and is exhausted from the exhaust pipe 231. At this time, the $NH_3$ gas is supplied to the wafer 200. Simultaneously, the valve 534 is opened to allow an $N_2$ gas to flow through the gas supply pipe 530. The flow rate of the $N_2$ gas flowing through the gas supply pipe 530 is adjusted by the MFC 532. The $N_2$ gas is supplied into the process chamber 201 together with the $NH_3$ gas and is exhausted from the exhaust pipe 231. At this time, in order to prevent the $NH_3$ gas from entering the nozzles 410 and 420, the valves 514 and 524 are opened to allow the $N_2$ gas to flow through the gas supply pipes 510 and 520. The $N_2$ gas is supplied into the process chamber 201 via the gas supply pipes 310 and 320 and the nozzles 410 and 420 and is exhausted from the exhaust pipe 231.

At this time, the internal pressure of the process chamber 201 may be set at a pressure which falls within a range of, for example, 1 to 3,990 Pa, by adjusting the APC valve 243. The supply flow rate of the $NH_3$ gas controlled by the MFC 332 may be set at a flow rate which falls within a range of, for example, 0.1 to 30 slm. The supply flow rates of the $N_2$ gas controlled by the MFCs 512, 522, and 532 may be respectively set at a flow rate which falls within a range of, for example, 0.1 to 30 slm. The time, during which the $NH_3$ gas is supplied to the wafer 200, may be set at a time which falls within a range of, for example, 0.01 to 30 seconds. The temperature of the heater 207 at this time may be set at the same temperature as that used at the $TiCl_4$ gas supply step.

At this time, the gases flowing through the process chamber 201 are only the $NH_3$ gas and the $N_2$ gas. The $NH_3$ gas undergoes a substitution reaction with at least a portion of the Ti-containing layer formed on the wafer 200 at the first step. During the substitution reaction, Ti contained in the Ti-containing layer and N contained in the $NH_3$ gas are combined to form a TiN layer containing Ti and N and containing substantially no Si on the wafer 200.

[Fourth Step]
(Residual Gas Removal)

After the TiN layer is formed, the valve 334 is closed to stop the supply of the $NH_3$ gas.

Then, the unreacted $NH_3$ gas, the $NH_3$ gas after the contribution to the formation of the TiN layer, or the reaction byproduct, which remains in the process chamber 201, are removed from the interior of the process chamber 201 according to the same processing procedures as those of the second step described above.

(Performing a Predetermined Number of Times)

A cycle which sequentially performs the first to fourth steps described above is implemented once or more (a predetermined number of times (n times)), whereby a TiN film having a predetermined thickness (e.g., 0.5 to 5.0 nm) can be formed on the wafer 200. The aforementioned cycle may be repeated multiple times.

(After-Purge and Atmospheric Pressure Return)

The $N_2$ gas is supplied from each of the gas supply pipes 510, 520, and 530 into the process chamber 201 and is exhausted from the exhaust pipe 231. The $N_2$ gas acts as a purge gas to thereby purge the interior of the process chamber 201 with an inert gas, so that the gas or the reaction byproduct, which remains in the process chamber 201, is removed from the interior of the process chamber 201 (after-purge). Thereafter, the internal atmosphere of the process chamber 201 is substituted by an inert gas (inert gas substitution). The internal pressure of the process chamber 201 is returned to an atmospheric pressure (atmospheric pressure return).

(Wafer Unloading)

Next, the seal cap 219 is moved down by the boat elevator 115 to open the lower end of the reaction tube 203. Then, the processed wafers 200 supported on the boat 217 are unloaded from the lower end of the reaction tube 203 to the outside of the reaction tube 203 (boat unloading). Thereafter, the processed wafers 200 are discharged from the boat 217 (wafer discharging).

(3) Effects According to the First Embodiment

According to the present embodiment, one or more effects as set forth below may be achieved.

(a) It is possible to efficiently discharge HCl which is generated during film formation and lowers the deposition rate, and to raise the deposition rate.

(b) It is possible to lower the resistivity.

(c) It is possible to improve the oxidation resistance.

(4) Exemplary Modification

In a modification of the first embodiment described above, as illustrated in FIG. 5, at the first step described above, the only difference is that the supply of the $SiH_4$ gas starts simultaneously with the supply of the $TiCl_4$ gas, and the supply of the $TiCl_4$ gas is stopped and then the supply of the $SiH_4$ gas is stopped, and the second to fourth steps are similar to those of the first embodiment described above. Even in this modification, the same effects as those of the film-forming sequence illustrated in FIG. 4 may be achieved. In the first embodiment and the modification described above, there has been described a configuration in which after the supply of the $TiCl_4$ gas and the supply of the $SiH_4$ gas are simultaneously performed, the supply of the $TiCl_4$ gas is stopped and then the $SiH_4$ gas is continuously supplied and stopped. However, the present disclosure is not limited thereto, but after the supply of the $TiCl_4$ gas and the supply of the $SiH_4$ gas are simultaneously performed, the residual gas may be removed by simultaneously stopping the gas supply. However, the configuration of stopping the supply of the $TiCl_4$ gas, continuously supplying the $SiH_4$ gas and then stopping the supply the $SiH_4$ gas in the first embodiment and the modification described above makes Si concentration to be lower. This is because HCl, which is the reaction byproduct, reacts with $SiH_4$ to be discharged in the form of $SiCl_4$, without giving time to adsorb on the wafer surface.

Second Embodiment

Figure 6:
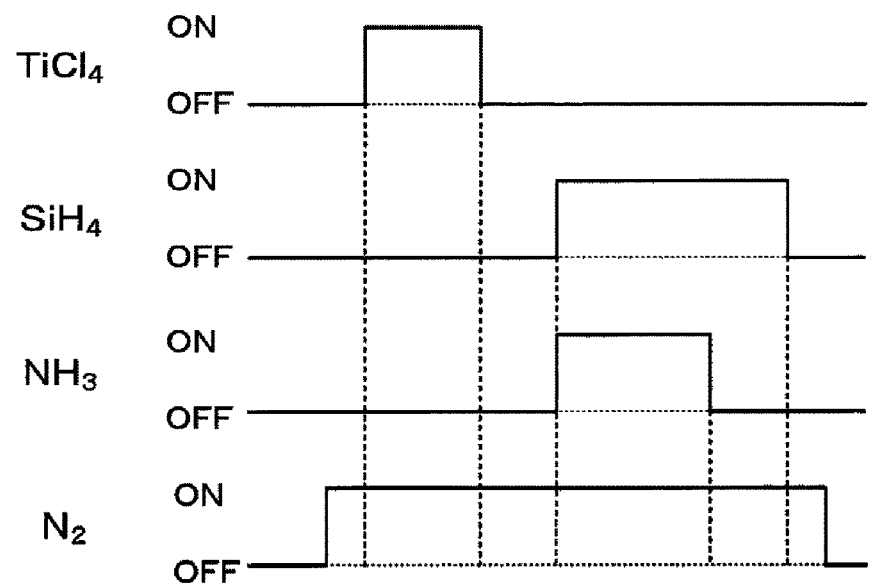
FIG. 6 is a diagram illustrating a gas supply timing according to a second embodiment of the present disclosure.

FIG. 6 is a diagram illustrating a gas supply timing according to a second embodiment of the present disclosure, applied to the present embodiment. In the following embodiment, only the gas supply timing will be described in detail.

[First Step]
($TiCl_4$ Gas Supply)

A $TiCl_4$ gas is supplied into the process chamber 201 according to the same processing procedures as those of the $TiCl_4$ gas supply step at the first step of the first embodiment. At this time, the gases flowing through the process chamber 201 are only the $TiCl_4$ gas and an $N_2$ gas, and a Ti-containing layer is formed on the wafer 200 (an underlying film on its surface) by the supply of the $TiCl_4$ gas.

[Second Step]
(Residual Gas Removal)

After the Ti-containing layer is formed, the unreacted $TiCl_4$ gas or the $TiCl_4$ gas after the contribution to the formation of the Ti-containing layer, which remains in the process chamber 201, is removed from the interior of the process chamber 201 according to the same processing procedures as those of the second step of the first embodiment.

[Third Step]
($NH_3$ Gas Supply)

After the residual gas in the process chamber 201 is removed, an $NH_3$ gas is supplied into the process chamber 201 according to the same processing procedures as those of the $NH_3$ gas supply step of the first embodiment.

($SiH_4$ Gas Supply)

Simultaneously, the valve 324 is opened to supply a $SiH_4$ gas into the process chamber 201 according to the same processing procedures as those of the $SiH_4$ gas supply step of the first embodiment. Furthermore, at this time, in order to prevent the $NH_3$ gas and the $SiH_4$ gas from entering the nozzle 410, the point that the valve 514 is opened to allow an $N_2$ gas to flow through the gas supply pipe 510 is different from the $SiH_4$ gas supply step of the first embodiment. The $N_2$ gas is supplied into the process chamber 201 via the gas supply pipe 310 and the nozzle 410 and is exhausted from the exhaust pipe 231. At this time, the $SiH_4$ gas, the $NH_3$ gas, and the $N_2$ gas are supplied to the wafer 200. At this time, the $NH_3$ gas undergoes a substitution reaction with at least a portion of the Ti-containing layer formed on the wafer 200 at the first step. During the substitution reaction, Ti contained in the Ti-containing layer and N contained in the $NH_3$ gas are combined to form a TiN layer containing Ti and N on the wafer 200.

After a lapse of a predetermined time from the start of the supply of the $NH_3$ gas, the valve 334 of the gas supply pipe 330 is closed to stop the supply of the $NH_3$ gas. At this time, in order to prevent the $SiH_4$ gas from entering the nozzles 410 and 430, the valves 514 and 534 are opened to allow the $N_2$ gas to flow through the gas supply pipes 510 and 530. The $N_2$ gas is supplied into the process chamber 201 via the gas supply pipes 310 and 330 and the nozzles 410 and 430 and is exhausted from the exhaust pipe 231. At this time, the $SiH_4$ gas and the $N_2$ gas are supplied to the wafer 200.

[Fourth Step]
(Residual Gas Removal)

After a lapse of a predetermined time since the TiN layer have been formed and the supply of the $SiH_4$ gas has started, the valve 324 is closed to stop the supply of the $SiH_4$ gas. At this time, the interior of the process chamber 201 is vacuum-exhausted by the vacuum pump 246 while keeping the APC valve 243 of the exhaust pipe 231 opened, and the unreacted $NH_3$ gas, the $NH_3$ gas after the contribution to the formation of the TiN layer, or the reaction byproduct, which remains in the process chamber 201, is removed from the interior of the process chamber 201 according to the same processing procedures as those of the second step described above. At this time, HCl, which is a growth inhibiting factor, reacts with $SiH_4$ to be discharged from the interior of the process chamber 201 as $SiCl_4$ and $H_2$.

(Performing a Predetermined Number of Times)

A cycle which sequentially performs the first step to fourth steps described above is implemented once or more (a predetermined number of times (n times)), whereby a TiN film having a predetermined thickness can be formed on the wafer 200.

(2) Effects According to the Second Embodiment

According to the present embodiment, one or more effects as set forth below may be achieved.

(a) It is possible to suppress the formation of $NH_4Cl$ due to the reaction between HCl and $NH_3$.

(3) Exemplary Modification

Figure 7:
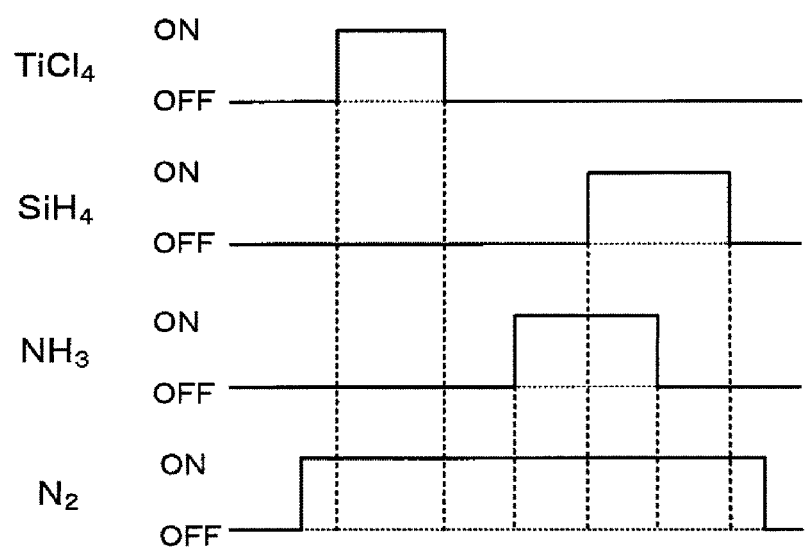
FIG. 7 is a diagram illustrating an exemplary modification of the gas supply timing according to the second embodiment of the present disclosure.

In a modification of the second embodiment described above, as illustrated in FIG. 7, at the third step described above, the only difference is that after a lapse of a predetermined time from the start of the supply of the $NH_3$ gas, the supply of the $SiH_4$ gas as the reducing gas starts, the supply of the $NH_3$ gas is stopped and then the supply of the $SiH_4$ gas is stopped, and the first step, the second step, and the fourth step are similar to those of the second embodiment described above. Even in this modification, the same effects as those of the film-forming sequence illustrated in FIG. 6 may be achieved.

Third Embodiment

Figure 8:
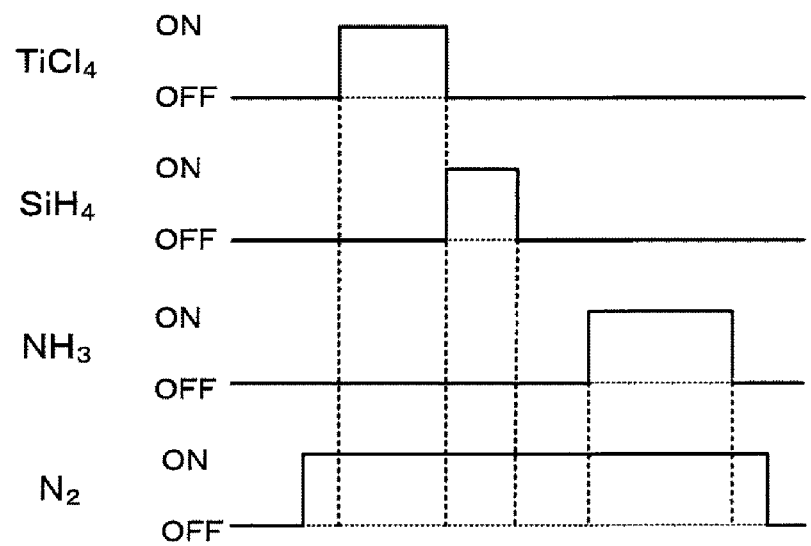
FIG. 8 is a diagram illustrating a gas supply timing according to a third embodiment of the present disclosure.

FIG. 8 is a diagram illustrating a gas supply timing according to a third embodiment of the present disclosure.

[First Step]
($TiCl_4$ Gas Supply)

A $TiCl_4$ gas is supplied into the process chamber 201 according to the same processing procedures as those of the $TiCl_4$ gas supplying step at the first step of the first embodiment. At this time, the gases flowing through the process chamber 201 are only the $TiCl_4$ gas and a $N_2$ gas, and a Ti-containing layer is formed on the wafer 200 (an underlying film on its surface) by the supply of the $TiCl_4$ gas.

[Second Step]
($SiH_4$ Gas Supply)

The valve 314 of the gas supply pipe 310 is closed to stop the supply of the $TiCl_4$ gas. Simultaneously, the valve 324 is opened to allow a $SiH_4$ gas as a reducing gas to flow through the gas supply pipe 320 according to the same processing procedures as those of the $SiH_4$ gas supply step at the first step of the first embodiment. That is, the supply of the $TiCl_4$ gas and the supply of the $SiH_4$ gas are continuously performed. At this time, the $SiH_4$ gas and the $N_2$ gas are supplied to the wafer 200.

[Third Step]
(Residual Gas Removal)

The valve 324 is closed to stop the supply of the $SiH_4$ gas. That is, at this time, the interior of the process chamber 201 is vacuum-exhausted by the vacuum pump 246 while keeping the APC valve 243 of the exhaust pipe 231 opened, and the unreacted $TiCl_4$ gas and $SiH_4$ gas or the $TiCl_4$ gas and $SiH_4$ gas after the contribution to the formation of the Ti-containing layer, which remain in the process chamber 201, are removed from the interior of the process chamber 201. At this time, the supply of the $N_2$ gas into the process chamber 201 is maintained while keeping the valves 514, 524 and 534 opened. The $N_2$ gas acts as a purge gas. This makes it possible to enhance the effect of removing the unreacted $TiCl_4$ gas and $SiH_4$ gas or the $TiCl_4$ gas and $SiH_4$ gas after the contribution to the formation of the Ti-containing layer, which remain in the process chamber 201, from the interior of the process chamber 201. At this time, HCl, which is a growth inhibiting factor, reacts with $SiH_4$ to be discharged from the interior of the process chamber 201 as $SiCl_4$ and $H_2$.

[Fourth Step]
($NH_3$ Gas Supply)

After the residual gas in the process chamber 201 is removed, an $NH_3$ gas, which is an N-containing gas as a reaction gas, is allowed to flow through the gas supply pipe 330 according to the same processing procedures as those of the $NH_3$ gas supply step at the third step of the first embodiment. At this time, the gases flowing through the process chamber 201 are only the $NH_3$ gas and an $N_2$ gas. The $NH_3$ gas undergoes a substitution reaction with at least a portion of the Ti-containing layer formed on the wafer 200 at the first step. During the substitution reaction, Ti contained in the Ti-containing layer and N contained in the $NH_3$ gas are bonded to form a TiN layer containing Ti and N on the wafer 200.

[Fifth Step]
(Residual Gas Removal)

After the TiN layer is formed, the valve 334 is closed to stop the supply of the $NH_3$ gas.

Then, the unreacted $NH_3$ gas, the $NH_3$ gas after the contribution to the formation of the TiN layer, or the reaction byproduct, which remains in the process chamber 201, is removed from the interior of the process chamber 201 according to the same processing procedures as those of the third step described above.

(Performing a Predetermined Number of Times)

A cycle which sequentially performs the first step to fifth steps described above is implemented once or more (a predetermined number of times (n times)), whereby a TiN film having a predetermined thickness can be formed on the wafer 200.

(2) Effects According to the Third Embodiment

According to the present embodiment, one or more effects as set forth below may be achieved.

(a) It is possible to discharge HCl generated after the supply of the $TiCl_4$ gas to the outside of the reaction tube by reacting it with $SiH_4$.

(3) Exemplary Modification

Figure 9:
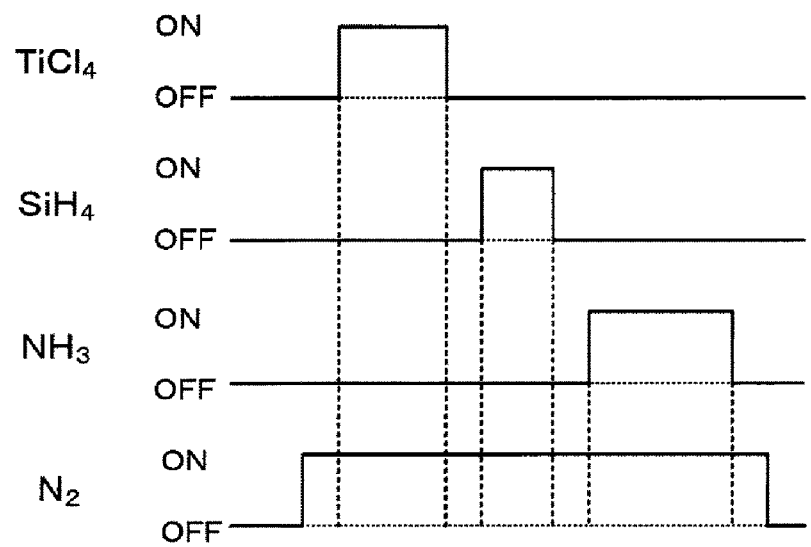
FIG. 9 is a diagram illustrating an exemplary modification of the gas supply timing according to the third embodiment of the present disclosure.

In a modification of the third embodiment described above, as illustrated in FIG. 9, the only difference is that it includes a step of removing the residual gas in the process chamber 201 between the first step of supplying the $TiCl_4$ gas and the second step of supplying the $SiH_4$ gas of the third embodiment described above. Even in this modification, the same effects as those of the film-forming sequence illustrated in FIG. 8 may be achieved.

Fourth Embodiment

Figure 10:
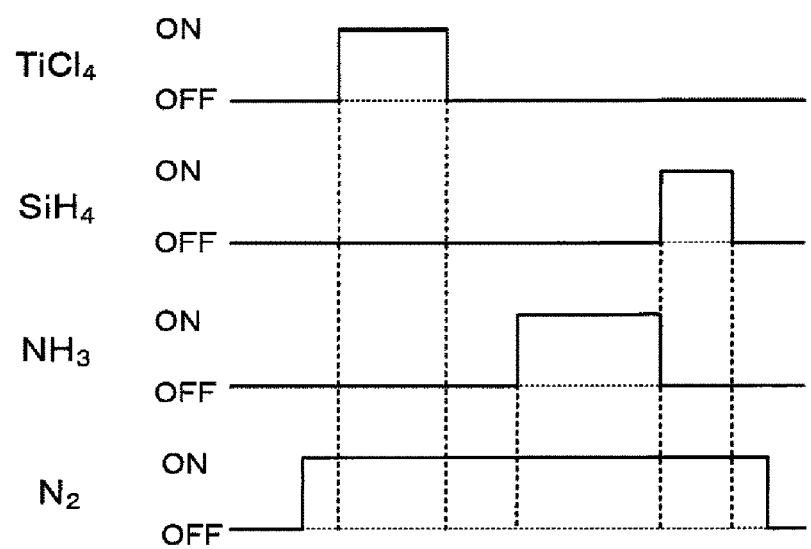
FIG. 10 is a diagram illustrating a gas supply timing according to a fourth embodiment of the present disclosure.

FIG. 10 is a diagram illustrating a gas supply timing according to a fourth embodiment of the present disclosure.

[First Step]
($TiCl_4$ Gas Supply)

The valve 314 is opened to supply a $TiCl_4$ gas into the process chamber 201 according to the same processing procedures as those of the $TiCl_4$ gas supply step at the first step of the first embodiment. At this time, the gases flowing through the process chamber 201 are only the $TiCl_4$ gas and an $N_2$ gas, and a Ti-containing layer is formed on the wafer 200 (an underlying film on its surface) by the supply of the $TiCl_4$ gas.

[Second Step]
(Residual Gas Removal)

The unreacted $TiCl_4$ gas or the $TiCl_4$ gas after the contribution to the formation of the Ti-containing layer, which remains in the process chamber 201, is removed from the interior of the process chamber 201 according to the same processing procedures as those of the residual gas removal step at the second step of the first embodiment.

[Third Step]
($NH_3$ Gas Supply)

An $NH_3$ gas, which is a N-containing gas as a reaction gas, is allowed to flow through the process chamber 201 according to the same processing procedures as those of the $NH_3$ gas supply step at the first step of the first embodiment. At this time, the gases flowing through the process chamber 201 are only the $NH_3$ gas and a $N_2$ gas. The $NH_3$ gas undergoes a substitution reaction with at least a portion of the Ti-containing layer formed on the wafer 200 at the first step. During the substitution reaction, Ti contained in the Ti-containing layer and N contained in the $NH_3$ gas are combined to form a TiN layer containing Ti and N on the wafer 200.

[Fourth Step]
($SiH_4$ Gas Supply)

The valve 334 of the gas supply pipe 330 is closed to stop the supply of the $NH_3$ gas. Simultaneously, the valve 324 is opened to allow a $SiH_4$ gas as a reducing gas to flow through the process chamber 201 according to the same processing procedures as the $SiH_4$ gas supply step at the first step of the first embodiment. That is, the $NH_3$ gas supply and the $SiH_4$ gas supply are continuously performed.

[Fifth Step]
(Residual Gas Removal)

The valve 324 is closed to stop the supply of the $SiH_4$ gas. That is, at this time, the interior of the process chamber 201 is vacuum-exhausted by the vacuum pump 246 while keeping the APC valve 243 of the exhaust pipe 231 opened, and the unreacted $NH_3$ gas, the $NH_3$ gas after the contribution to the formation of the TiN layer, or the reaction byproduct, which remains in the process chamber 201, is removed from the interior of the process chamber 201. At this time, HCl, which is a growth inhibiting factor, reacts with $SiH_4$ to be discharged from the interior of the process chamber 201 as $SiCl_4$ and $H_2$.

(Performing a Predetermined Number of Times)

A cycle which sequentially performs the first step to fifth steps described above is implemented once or more (a predetermined number of times (n times)), whereby a TiN film having a predetermined thickness can be formed on the wafer 200.

(2) Effects According to the Third Embodiment

According to the present embodiment, one or more effects as set forth below may be achieved.

(a) It is possible to discharge HCl remaining after the supply of the $NH_3$ gas to the outside of the reaction tube by reacting it with $SiH_4$.

(3) Exemplary Modification

Figure 11:
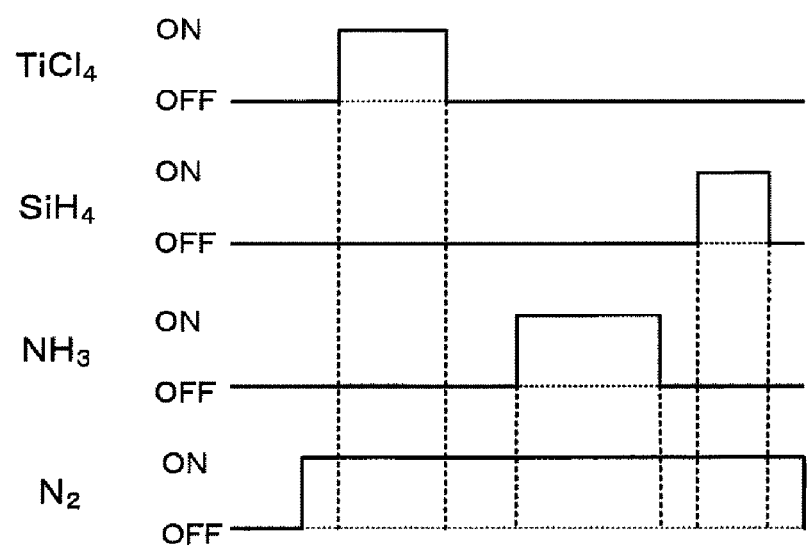
FIG. 11 is a diagram illustrating an exemplary modification of the gas supply timing according to the fourth embodiment of the present disclosure.

In a modification of the fourth embodiment described above, as illustrated in FIG. 11, the only difference is that it includes a step of removing the residual gas within the process chamber 201 between the third step of supplying the $NH_3$ gas and the fourth step of supplying the $SiH_4$ gas of the fourth embodiment described above. Even in this modification, the same effects as those of the film-forming sequence illustrated in FIG. 10 may be achieved.

An experimental example will be described below, but the present disclosure is not limited to the experimental example.

EXPERIMENTAL EXAMPLE

Figure 4:
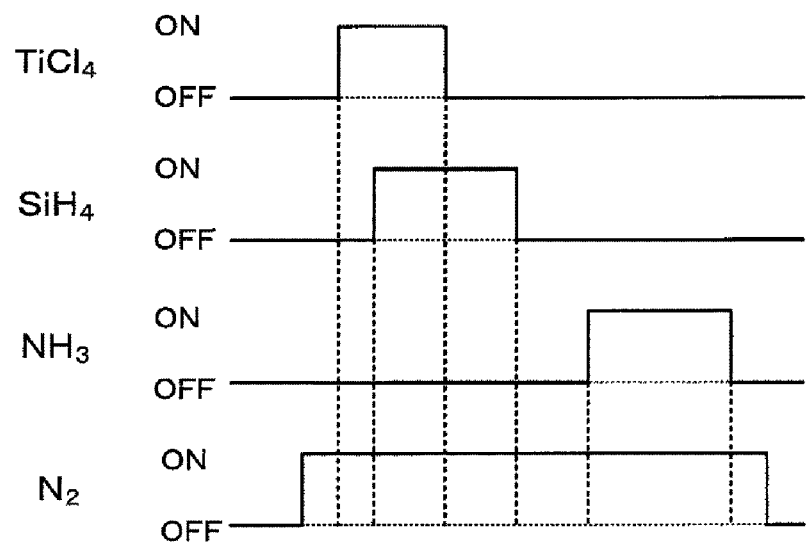
FIG. 4 is a diagram illustrating a gas supply timing according to a first embodiment of the present disclosure.
Figure 5:
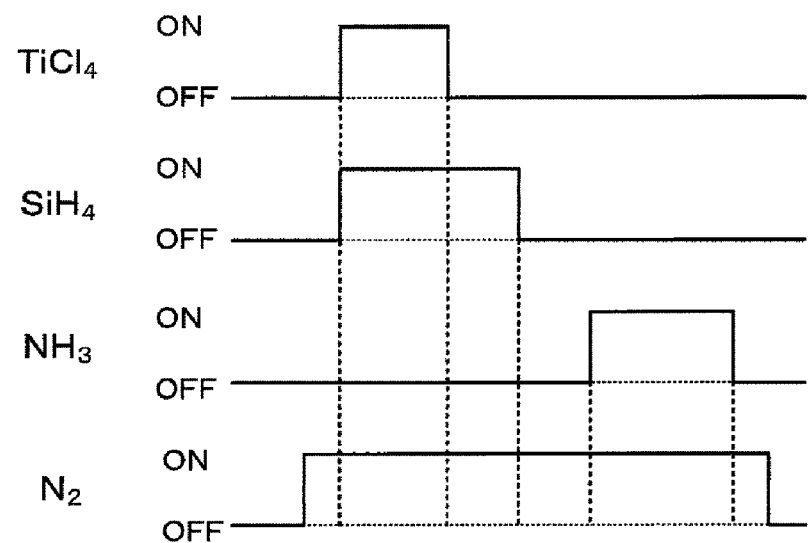
FIG. 5 is a diagram illustrating an exemplary modification of the gas supply timing according to the first embodiment of the present disclosure.

In this example, a TiN film was formed using the gas supply timing illustrated in FIG. 4 in the aforementioned embodiments. In a comparative example, a TiN film was formed using a gas supply timing illustrated in FIG. 12. Specifically, in the comparative example, the TiN film was formed by repeatedly performing the $TiCl_4$ gas supply, the residual gas removal, the $NH_3$ gas supply, and the residual gas removal.

Figures 12, 13A, 13B:
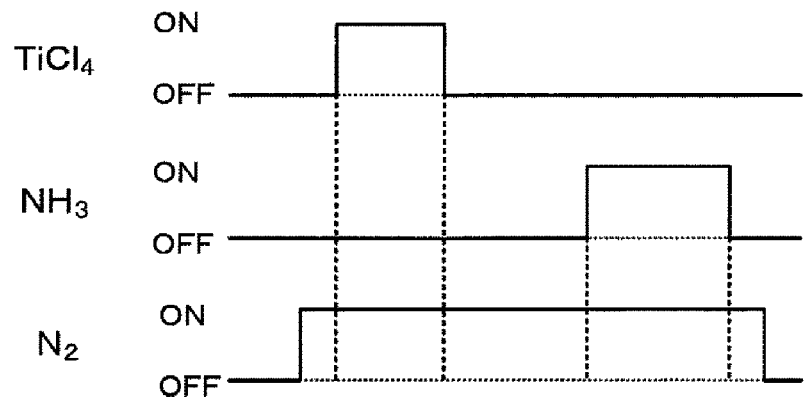
FIG. 12 is a diagram illustrating a gas supply timing according to a comparative example of the present disclosure.
FIG. 13A is a diagram illustrating a deposition rate according to the present example and a deposition rate according to the comparative example.
FIG. 13B is a diagram illustrating a film composition of a TiN film formed according to the present example and a film composition of a TiN film formed according to the comparative example.

As illustrated in FIG. 13A, the TiN film formed according to the comparative example had a deposition rate 0.029 nm/cycle and a resistivity of 225 uΩcm, whereas the TiN film formed according to this example had a deposition rate of 0.127 nm/cycle and a resistivity of 178 uΩcm. That is, it could be confirmed that the TiN film formed according to this example had a higher deposition rate and a lower resistivity than the TiN film formed according to the comparative example.

Furthermore, as illustrated in FIG. 13B, a film composition of the TiN film formed according to the comparative example was 49.2% for Ti, 49.8% for N, and 1.0% for Cl, whereas a composition of the TiN film formed according to this example was 40.7% for Ti, 59.2% for N, and 0.08% for Cl. That is, it could be confirmed that the Cl concentration in the TiN film formed according to this example can be lower than that of the TiN film formed according to the comparative example.

Figure 14A:
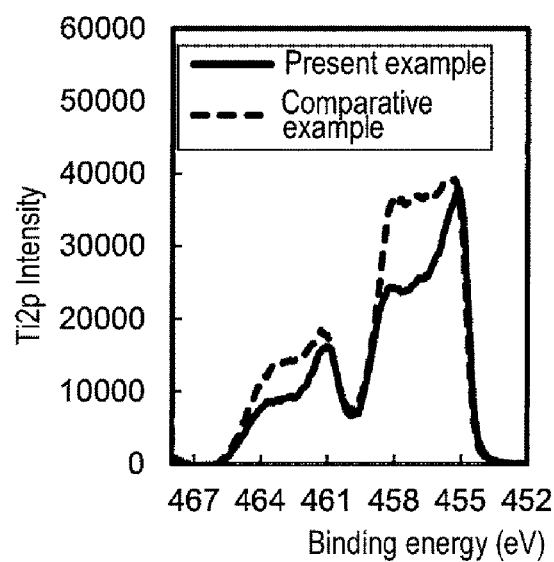
Figure 14B:
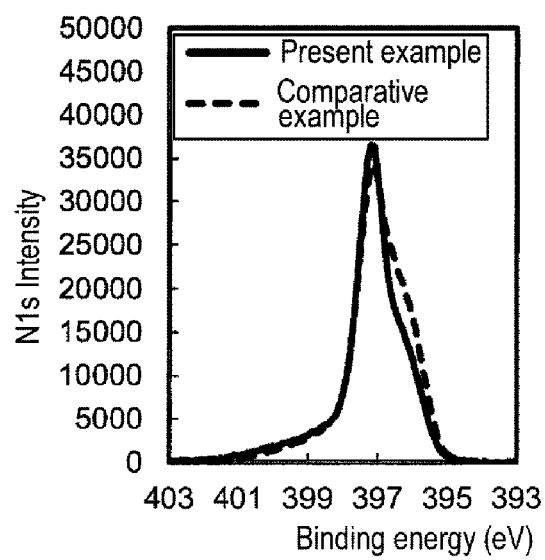
Figure 14C:
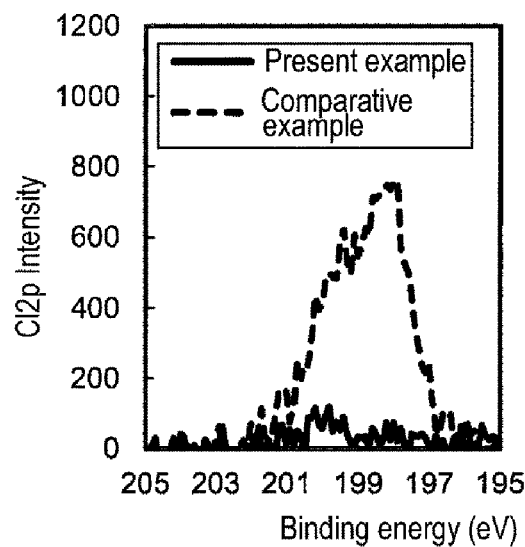

FIGS. 14A to 14C are diagrams illustrating X-ray photoelectron spectroscopy (XPS) spectra of the TiN film formed according to this example and the TiN film formed according to the comparative example. As illustrated in FIGS. 14A and 14B, it could be confirmed that, in the TiN film formed according to the comparative example, the peak was increased near 458 to 459 eV indicative of a Ti—O bond to react with oxygen (O) in the atmosphere. On the other hand, it could be seen that, in the TiN film formed according to this example, the peak was increased near 455 eV indicative of a Ti-bond to reduce a Ti—O bond due to oxygen in the atmosphere. Moreover, as illustrated in FIG. 14C, it could be seen that the Cl residual concentration in the TiN film formed according to this example was lower than that of the TiN film formed according to the comparative example.

That is, it could be confirmed that it is possible to prevent the oxidation of the TiN film by the atmosphere, in addition to lowering the resistivity and the Cl residual concentration in the film, by using this example. This is considered to be because the TiN film formed according to this example is more N-rich than the stoichiometric composition of Ti:N=1:1, to become a film which is difficult to be oxidized. Furthermore, the Cl concentration of the TiN film formed according to this example was 1% or less. This is considered to be because HCl does not exist when the $NH_3$ gas is supplied, so that $NH_3$ is more easily adsorbed. Even when HCl exists, $NH_3$ is consumed in forming ammonium chloride ($NH_4Cl$) as the byproduct. That is, it could be confirmed that, by reducing HCl, which is a growth inhibiting factor, it is possible to obtain a higher deposition rate than the TiN film formed according to the comparative example.

The Si content (Si concentration) in the TiN film formed according to the present embodiment is about 4%. A mechanism by which the Si content in the TiN film formed according to the present embodiment is significantly reduced will now be described.

Figure 15:
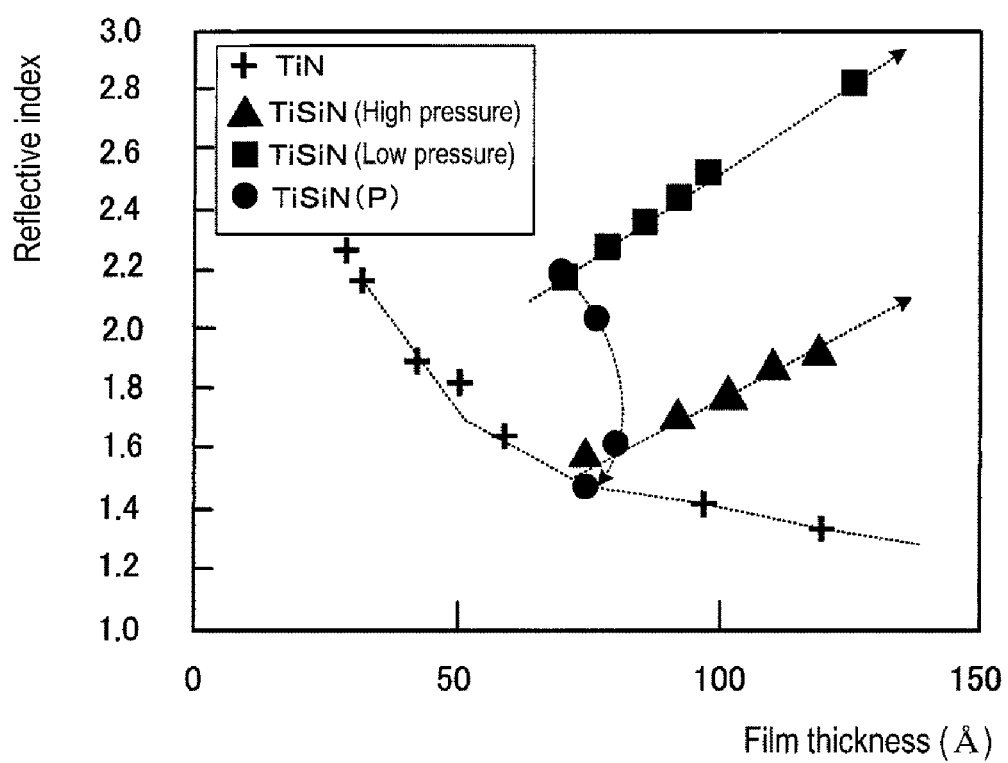
FIG. 15 is a diagram illustrating a relationship among an internal pressure of a process chamber, a refractive index, and a film thickness when a $SiH_4$ gas is supplied.

FIG. 15 is a diagram illustrating a relationship between a film thickness and a refractive index of the TiN film formed when the $SiH_4$ gas as the reducing gas of the aforementioned embodiments is supplied with the internal pressure of the process chamber 201 at a low pressure of about 1 Pa to 300 Pa (■ in FIG. 15) and at a high pressure of about 500 Pa to 2,660 Pa (▲ in FIG. 15), and by changing the low pressure to the high pressure (● in FIG. 15). In FIG. 15, "+" indicates a film thickness dependence of the refractive index of the TiN film. The horizontal axis indicates a film thickness, and the vertical axis indicates a refractive index. It is meant that the higher the refractive index on the vertical axis, the higher the Si content in the film.

According to FIG. 15, it can be confirmed that the Si content (refractive index) in the film can be reduced by setting the internal pressure of the process chamber 201 during the supply of the $SiH_4$ gas at a high pressure of about 500 Pa to 2,660 Pa. In addition, it can be confirmed that, even in the case of a low pressure of about 1 Pa to 300 Pa and a high pressure of about 500 Pa to 2,660 Pa, if the supply time or the supply flow rate of the $SiH_4$ gas after the supply stop of the $TiCl_4$ gas is increased beyond a predetermined value, Si enters the film so that the Si content in the film is increased to change the TiN layer to a TiSiN layer. That is, the Si content (refractive index) can be reduced to form a TiN layer not containing a Si atom, by setting the internal pressure of the process chamber 201 during the supply of the $SiH_4$ gas at a high pressure which falls within a range of, for example, 130 to 3,990 Pa, specifically 500 to 2,660 Pa, or more specifically 900 to 1,500 Pa, by adjusting the APC valve 243, by adjusting the supply time of the $SiH_4$ gas at a time which falls within a range of, for example, 0.1 to 60 seconds, specifically 0.5 to 30 seconds, or more specifically 1 to 20 seconds, and by adjusting the supply flow rate of the $SiH_4$ gas to a flow rate which falls within a range of, for example, 0.1 to 5 slm, specifically 0.5 to 3 slm, or more specifically 1 to 2 slm.

That is, even when the internal pressure of the process chamber 201 during the supply of the $SiH_4$ gas is a high pressure which falls within a predetermined range, if the supply time of the $SiH_4$ gas is long or the supply amount thereof is large, the refractive index becomes equal to or higher than when the internal pressure of the process chamber 201 is a low pressure. Therefore, in addition to specifying the pressure range, the supply time and the supply amount may be specified.

Figure 16:
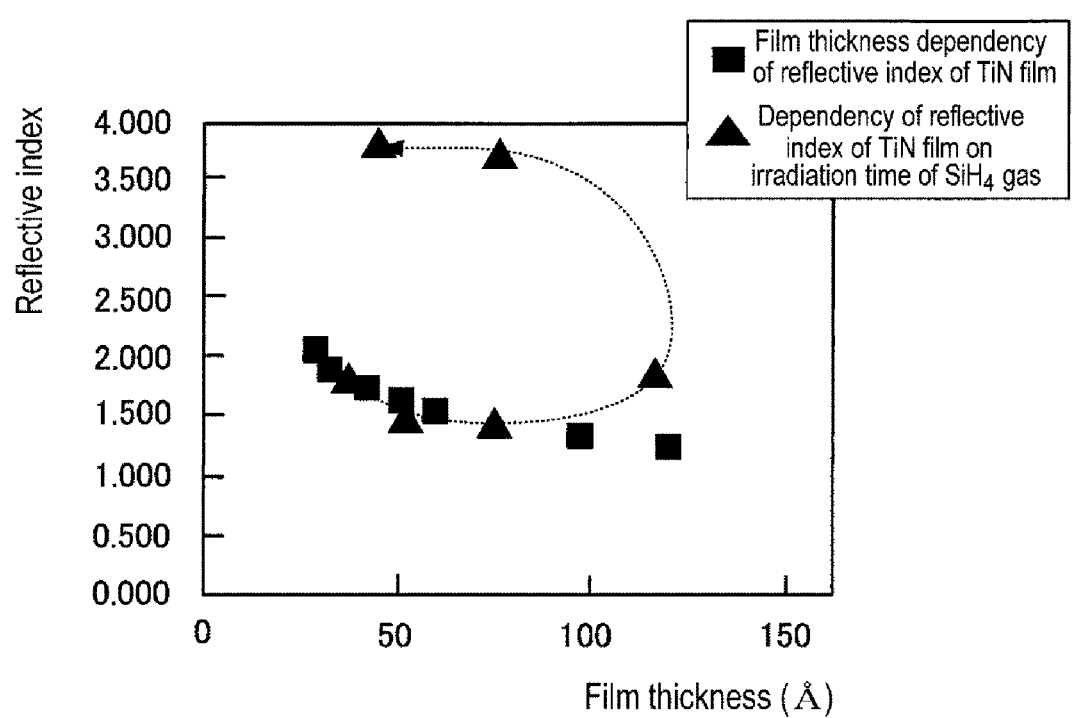
FIG. 16 is a diagram illustrating a critical value of a supply time of a $SiH_4$ gas.

FIG. 16 is a diagram illustrating a critical value of the supply time of the $SiH_4$ gas as the reducing gas of the aforementioned embodiments. The horizontal axis indicates a film thickness, and the vertical axis indicates a refractive index. In FIG. 16, ■ indicates a film thickness dependence of the refractive index of the TiN film, and ▲ indicates a dependence of the refractive index of the TiN film on the irradiation time of the $SiH_4$ gas. At this time, the temperature of the heater 207 was set such that the temperature of the wafer 200 became 475 degrees C. A plot above a plot (■) of the film thickness dependence of the refractive index of the TiN film illustrated in FIG. 16 indicates that Si is contained. Furthermore, in a plot (▲) of a dependency of the refractive index of the TiN film on the irradiation time of the $SiH_4$ gas illustrated in FIG. 16, an experiment was conducted by extending the supply time to 5 seconds, 10 seconds, 20 seconds, . . . , 90 seconds in an arrow direction near the film thickness 38 Å. Thus, it could be confirmed that the upper limit value of the supply time of the $SiH_4$ gas was about 20 seconds.

Furthermore, in the embodiments and the example described above, there has been made a description using $TiCl_4$ as the precursor gas. However, the present disclosure is not limited thereto but may be applied to a halogen-containing gas such as tungsten hexafluoride ($WF_6$), tantalum tetrachloride ($TaCl_4$), tungsten hexachloride ($WCl_6$), tungsten pentachloride ($WCl_5$), molybdenum tetrachloride ($MoCl_4$), silicon tetrachloride ($SiCl_4$), disilicon hexachloride ($Si_2Cl_6$) or hexachlorodisilane (HCDS), or a Cl-containing gas in some embodiments and may be applied to films formed using them. Moreover, the present disclosure may be applied to a Si-based gas such as trichlorodisilane (TCS) or the like, in addition to the tantalum (Ta)-based, and may be applied to films formed using them.

In the embodiments and the example described above, there has been made a description using $SiH_4$ as the reducing gas for reducing HCl. However, the present disclosure is not limited thereto but may be applied to a gas such as, for example, disilane ($Si_2H_6$), trisdimethylaminosilane (SiH[N($CH_3$)$_2$]), diborane ($B_2H_6$), phosphine ($PH_3$) or the like, containing H.

Furthermore, in the embodiments and the example described above, there has been made a description using one kind of reducing gas. However, the present disclosure is not limited thereto but two or more kinds of reducing gas may be used.

In addition, in the embodiments and the examples described above, there has been made a description using HCl as the byproduct to be reduced using the reducing gas. However, the present disclosure is not limited thereto but may be applied to a gas such as hydrogen fluoride (HF), hydrogen iodide (HI), bromide hydrogen (HBr) or the like.

Moreover, in the embodiments and the example described above, there have been described a configuration in which the $TiCl_4$ gas as the precursor gas and the $SiH_4$ gas as the reducing gas are respectively supplied from the nozzles 410 and 420 into the process chamber 201. However, the present disclosure is not limited thereto but they may be supplied by their premix from one nozzle.

Furthermore, in the embodiments and the example described above, there has been described a configuration in which the reducing gas is supplied simultaneously with or after the supply of the $TiCl_4$ gas, or simultaneously with or after the supply of the $NH_3$ gas. However, the present disclosure is not limited thereto but may be applied to a configuration in which a reducing gas is supplied at the time of supplying each of the $TiCl_4$ gas and the $NH_3$ gas or after supplying each of the $TiCl_4$ gas and the $NH_3$ gas.

Furthermore, in the embodiments and the example described above, there has been described a configuration in which films are formed using a batch-type substrate processing apparatus capable of processing a plurality of substrates at a time. However, the present disclosure is not limited thereto but may be suitably applied to a case where films are formed using a single-wafer-type substrate processing apparatus capable of processing one substrate or several substrates at a time.

According to the present disclosure in some embodiments, it is possible to reduce a film formation inhibiting factor of a metal film by supplying a reducing gas that reacts with a byproduct generated in a film-forming process into a process chamber and discharging it to outside of the process chamber.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A method of processing a substrate, comprising:
    forming a metal-containing film on the substrate by sequentially performing:
    (a) supplying a first gas, which contains a metal and a halogen, and a first reducing gas, which contains silicon and hydrogen and does not contain a halogen, to the substrate in a process chamber by setting an internal pressure of the process chamber to a value in a predetermined pressure range, wherein (a) includes a time period of simultaneously supplying the first gas and the first reducing gas and a time period of supplying the first gas;
    (b) removing the first gas and the first reducing gas that remain in the process chamber;
    (c) supplying a second gas to the substrate; and
    (d) removing the second gas remaining in the process chamber.

2. The method according to claim 1, wherein (a), (b), (c), and (d) are sequentially repeated a plurality number of times.

3. The method according to claim 1, wherein in (a), the supply of the first gas starts while the first reducing gas is not supplied to the substrate.

4. The method according to claim 1, wherein in (a), the internal pressure of the process chamber is set to a value which falls within a range of 500 Pa to less than 2,660 Pa during at least the supply of the first reducing gas.

5. The method according to claim 1, wherein the first reducing gas is one of monosilane, disilane, and trisdimethylaminosilane.

6. The method according to claim 1, wherein the first gas is a halide.

7. The method according to claim 1, wherein the first gas contains a titanium element, and the metal-containing film is a titanium nitride film.

8. The method according to claim 1, wherein in (a), the first reducing gas is supplied after a lapse of 0.01 or more and 5 seconds or less from the start of the supply of the first gas.

9. The method according to claim 1, wherein in (a), the internal pressure of the process chamber during the supply of the first reducing gas is set higher than the internal pressure of the process chamber during the supply of only the first gas.

10. The method according to claim 1, wherein in (a), a supply time of the first reducing gas is set at 0.01 seconds or more and 60 seconds or less.

11. The method according to claim 1, wherein in (a), the supply of the first reducing gas starts when or after the supply of the first gas starts.

12. The method according to claim 1, wherein the second gas is a second reducing gas.

13. The method according to claim 12, wherein the second reducing gas contains nitrogen.

14. The method according to claim 13, wherein the metal-containing film is a metal nitride film.

15. A method of manufacturing a semiconductor device, comprising the method of claim 1.

16. A substrate processing apparatus, comprising:
a process chamber configured to accommodate a substrate;
a gas supply system configured to supply a first gas, which contains a metal and a halogen, a first reducing gas which contains silicon and hydrogen and does not contain a halogen, and a second gas into the process chamber;
an exhaust system configured to exhaust an interior of the process chamber; and
a controller configured to be capable of controlling the gas supply system and the exhaust system to form a metal-containing film on the substrate by sequentially performing:
(a) supplying a first gas, which contains a metal and a halogen, and a first reducing gas, which contains silicon and hydrogen and does not contain a halogen, to the substrate in a process chamber by setting an internal pressure of the process chamber to a value in a predetermined pressure range, wherein (a) includes a time period of simultaneously supplying the first gas and the first reducing gas and a time period of supplying the first gas;
(b) removing first gas and the first reducing gas that remain in the process chamber;
(c) supplying the second gas to the substrate; and
(d) removing the second gas remaining in the process chamber.

17. A non-transitory computer-readable recording medium storing a program that causes, by a computer, a substrate processing apparatus to perform a process comprising:
forming a metal-containing film substantially not containing a silicon atom on a substrate by sequentially performing:
(a) supplying a first gas, which contains a metal and a halogen, and a first reducing gas, which contains silicon and hydrogen and does not contain a halogen, to the substrate in a process chamber by setting an internal pressure of the process chamber to a value in a predetermined pressure range, wherein (a) includes a time period of simultaneously supplying the first gas and the first reducing gas and a time period of supplying the first gas;
(b) removing first gas and the first reducing gas that remain in the process chamber;
(c) supplying the second gas to the substrate; and
(d) removing the second gas remaining in the process chamber.

* * * * *